(12) United States Patent
Honda et al.

(10) Patent No.: US 6,361,712 B1
(45) Date of Patent: Mar. 26, 2002

(54) COMPOSITION FOR SELECTIVE ETCHING OF OXIDES OVER METALS

(75) Inventors: Kenji Honda, Warwick; Michelle Elderkin, Pawtucket, both of RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 09/418,610

(22) Filed: Oct. 15, 1999

(51) Int. Cl.⁷ .................................................. C23F 1/44

(52) U.S. Cl. ..................... 252/79.3; 252/79.4; 252/79.5; 510/175; 510/176; 510/255; 510/257; 216/101; 216/107

(58) Field of Search ................................ 510/255, 175, 510/176, 257; 252/79.3, 79.4; 438/745, 906; 134/1.3, 3; 216/101, 109

(56) References Cited

U.S. PATENT DOCUMENTS

| 4,204,013 | A | 5/1980 | Arcilesi et al. | 427/304 |
|---|---|---|---|---|
| 5,545,353 | A | 8/1996 | Honda et al. | 510/176 |
| 5,780,406 | A | 7/1998 | Honda et al. | 510/175 |
| 5,792,274 | A | 8/1998 | Tanabe et al. | 134/1.3 |
| 6,030,932 | A | 2/2000 | Leon et al. | 510/175 |
| 6,033,993 | A | 3/2000 | Love, Jr. et al. | 438/745 |

FOREIGN PATENT DOCUMENTS

EP     0 827 188 A2     3/1998

*Primary Examiner*—Randy Gulakowski
*Assistant Examiner*—Allan Olsen
(74) *Attorney, Agent, or Firm*—Ohlandt, Greeley, Ruggerio & Perle, LLP

(57) ABSTRACT

A composition for selective etching of oxides over a metal. The composition contains water, hydroxylammonium salt, carboxylic acid, a fluorine containing compound, and optionally, a base. The pH of the composition is about 2 to 6.

12 Claims, No Drawings

US 6,361,712 B1

COMPOSITION FOR SELECTIVE ETCHING OF OXIDES OVER METALS

FIELD OF THE INVENTION

The present invention relates to a composition for use in microelectronics applications. More particularly, the present invention relates to a composition for selectively etching oxides remaining after plasma etching and/or chemical mechanical polishing (CMP) of a metal substrate having low dielectric constant (low-k) interlayers.

BACKGROUND OF THE INVENTION

As the dimension of the photolithographic pattern on a wafer continues to shrink below 0.18 microns, greater demands are placed on lithographic equipment and materials. To meet this challenge, the semiconductor industry is turning to copper and low dielectric constant (low-k) materials to manufacture chips. Copper is known to provide as much as a 40% decrease in resistance. Moreover, when using low-k materials there is a decrease in capacitance, which is critical to improving integrated circuit performance, especially for higher density memory chips. More and more, the metal substrate and inter-dielectric layer materials are changing from aluminum based alloys and silicon dioxide to copper metal and the new low-k dielectrics.

Low-k materials can be divided into two categories. The first category includes inorganic low-k materials such as hydrogen silsesquioxane (HSQ), fluorinated silicon glass (FSG), or other non-carbon containing silicon based materials. The second category is comprised of organic low-k materials, such as bisbenzocyclobutene (BCB) available from Dow Chemical and poly(arylene ether) sold under the tradenames FLARE from Allied Signal, and SiLK from Dow Chemical.

To utilize copper and the low-k materials, new manufacturing methods are employed. One method is the Damascene method, which follows several basic steps. First, an insulator is deposited. Next, a photoresist pattern with the reverse image of the metal is added. This is followed by etching a trough in the oxide at a depth equal to the desired metal thickness. A liner and copper are then deposited. This is followed by chemical mechanical planarization to remove the excess copper.

An essential step in the manufacturing process is the removal of residues from the wafer surface. Cleaning compositions for cleaning silicon or aluminum wafer surfaces are well known in the art. However, compositions that are effective in selectively etching oxide residues from a metal substrate that contains low-k interlayers, are not readily available. The industry's move to copper and low-k materials has created a need for such a composition that is specifically formulated to remove residues from a metal substrate, i.e. copper, without damaging the low-k interlayers.

SUMMARY OF THE INVENTION

The present invention is directed to a composition for selectively etching oxide residues remaining after plasma etching and/or chemical mechanical polishing, from a metal substrate such as copper that has low-k interlayers. The composition contains water, hydroxylammonium salt, carboxylic acid, a fluorine containing compound, and optionally, a base. The pH of the composition is about 2 to 6.

DETAILED DESCRIPTION OF THE INVENTION

The present invention is a composition that has utility for selectively etching the oxide residue that remains after plasma etching and/or chemical mechanical polishing of a metal substrate that contains low-k interlayers. The metal substrate may be, for example, copper, aluminum, tantalum, or tungsten. The present invention removes the residue without damaging the metal substrates and the low-k interlayers contained within the substrate.

In the present invention, the composition is comprised of water, hydroxylammonium salt, carboxylic acid, and a fluorine-containing compound. In addition, a base may be included.

The present invention includes a water soluble hydroxylammonium salt of an organic or inorganic acid that removes post-etch residue. Hydroxylamnmonium salts, such as hydroxylammonium sulfate (HAS), are effective in dissolving the post-etch residue formed on a silicon dioxide/titanium nitride/aluminum-copper substrate, due to its acidity and physical/chemical properties. For example, HAS is a major component in MICROSTRIP 5002, a product commercially available from Arch Chemicals, Inc., which is useful in removing post-etch residues remaining after via and aluminum line etching. The hydroxylammonium salt may be, for example, hydroxylammonium sulfate, hydroxylammonium nitrate, hydroxylammonium phosphate, hydroxylammonium chloride, hydroxylammonium oxalate, hydroxylammonium citrate, hydroxylammonium lactate, or mixtures thereof. The preferred hydroxylammonium salt is hydroxylammonium sulfate.

The composition of the present invention includes about 0.01 wt. % to 5.0 wt. % of a hydroxylanmmonium salt. Preferably about 0.05 wt. % to 1.0 wt. %, and most preferably about 0.1 wt. % to 0.5 wt. % of a hydroxylammonium salt is included.

A carboxylic acid must be included in the composition of the present invention. The carboxylic acid serves as a corrosion inhibitor. Carboxylic acids, especially those containing hydroxyl groups, can effectively inhibit metal corrosion of aluminum, copper, and their alloys. The carboxylic acids have a chelating effect on those metals. Suitable carboxylic acids include monocarboxylic and polycarboxylic acids. For example, the carboxylic acid may be, but is not limited to, formic acid, acetic acid, propionic acid, valeric acid, isovaleric acid, oxalic acid, malonic acid, succinic acid, glutaric acid, maleic acid, filmaric acid, phthalic acid, 1,2, 3-benzenetricarboxylic acid, glycolic acid, lactic acid, citric acid, salicylic acid, tartaric acid, gluconic acid, and mixtures thereof. The preferred carboxylic acid is citric acid.

The carboxylic acid is conveniently added in an amount about 0.01 wt. % to 5.0 wt. %. Preferably about 0.05 wt. % to 3.0 wt. %, and most preferably about 0.1 wt. % to 1.0 wt. % of carboxylic acid is added.

The present invention requires the presence of a water soluble fluorine-containing compound that may be organic or inorganic. The fluorine-containing compound acts as a selective etchant for oxides against metals. For example, fluorine-containing compounds, particularly fluoride salts like hydrogen fluoride (HF) are known to selectively attack silicon dioxide against silicon due to cleavage of Si—O—Si bonding. It is also known that some fluorine containing compounds can cleave Cu—O—Cu bonding so that CuOx can be selectively etched against copper. Examples of suitable fluorine-containing compounds are, hydrogen fluoride, anumonium fluoride, hydrogen fluoride pyridine salt, hydrogen fluoride imidazole salt, tetramethylammonium fluoride, tetraethylammonium fluoride, hydrogen fluoride polyvinylpyridine salt, hydrogen fluoride polyvinylimidazole salt, hydrogen fluoride polyallylamine salt, or mixtures thereof. Hydrogen fluoride is the preferred fluorine containing compound.

The composition includes about 0.001 wt. % to 3.0 wt. % of a fluorine-containing compound. Preferably about 0.005 wt. % to 1.0 wt. %, and most preferably about 0.01 wt. % to 0.5 wt. % of the composition is a fluorine containing compound.

Optionally, the composition may include a base. The base is used to adjust the pH of the composition, which must be about 2 to 6. Preferably, the pH of the composition is about 3.0 to 4.5. It is critical that the pH of the cleaning composition be acidic. This enables the composition to selectively etch metal oxides such as any oxide of copper or mixtures thereof (CuOx) against silicon dioxide as well as metals like copper and aluminum. Silicon dioxide readily dissolves in an alkaline pH region, but not where the pH is neutral or acidic. In contrast, metal oxides such as CuOx dissolve in both acidic and alkaline pH environments. As such, the pH of the composition of the present invention is set to or adjusted to about 2 to 6. The pH is adjusted by adding a base. The base can be, for example, a tetraalkylammonium hydroxide, such as tetramethylammonium hydroxide (TMAH), tetraethylamrnonium hydroxide, or mixtures thereof. Tetramethylammonium hydroxide is the preferred base to be used in the present invention.

The present invention may also include a water-miscible organic solvent. The water-miscible organic solvent enhances the penetration of water into the photoresist film with other components, particularly the fluorine-containing compound. This accelerates the silicon dioxide etching to remove the photoresist film from the low-k layer. In actuality, the low-k film is on the copper layer directly or indirectly through another layer such as silicon nitride, which is not etched by the present invention, so that the low-k film is not removed. The water-miscible organic solvent may be, for example, ethylene glycol (EG), propylene glycol (PG), dimethylsulfoxide (DMSO), dimethylacetamide (DMA), ethyl lactate (EL), propylene glycol monoethylether acetate (PGMEA), or mixtures thereof.

The present invention may further include additives. Additives such as chelating compounds or surface active agents can enhance the effectiveness of the composition of the present invention in removing particulate and/or metallic contaminants from the wafer surface. Suitable additives are, for example, nonionic surfactants, especially chelating group attached polyoxyethylene type surfactant known as CS-1, which is commercially available from BASF.

In a preferred embodiment of the present invention, the composition for selective etching of oxides over metals comprises: water, about 0.1 wt. % to 0.5 wt. % hydroxylammonium sulfate, about 0.1 wt. % to 1.0 wt. % citric acid, about 0.01 wt. % to 0.5 wt. % hydrogen fluoride, and has a pH of about 3.0 to 4.5. Moreover, the composition has a molar ratio of citric acid to hydrogen fluoride of about 1 to 5.

The present invention also includes a method for removing the residue on a metal substrate, such as copper, aluminum, tantalum, or tungsten having low-k interlayers comprising the step of applying a composition comprising (a) water, (b) hydroxylammonium salt, (c) carboxylic acid, and (d) a fluorine containing compound to the metal substrate. The composition may be applied, for example, by immersing or spraying the composition onto the metal substrate with or without sonication. The composition may also include a base and/or a water-miscible organic solvent. It is also preferred that the composition have a pH of about 2 to 6. More preferably, the pH should be about 3.0 to 4.5.

To illustrate the present invention, the following example is provided. It should be understood that the present invention is not limited to the example described.

EXAMPLE 1

A cleaner solution of the present invention was prepared as follows:

(1) 70 g of deionized water (DI $H_2O$) was placed in a beaker;

(2) 0.20 g of hydroxylammonium sulfate (HAS) was completely dissolved in the deionized water, at room temperature using agitation from a magnetic stirrer;

(3) 0.10 g of citric acid (CA) was dissolved in the above solution;

(4) 0.21 g of hydrofluoric acid (HF) was added to the above solution with agitation;

(5) Tetramethylammonium hydroxide (TMAH) aqueous solution was added to the above solution to adjust the pH to 3.37;

(6) Deionized water was added to bring the total weight of the solution to 100 g.

The resulting cleaner solution contained 0.2 wt. % of HAS, 0.1 wt. % of CA, and 0.1 wt. % of HF, at a pH of 3.37.

An etch test was conducted using copper and copper oxide-deposited wafers, which were obtained from Wafernet, Inc., San Jose, Calif. The wafer specifications were as follows:

| Specification | Cu | CuOx |
| --- | --- | --- |
| Resistivity | <0.025 | <0.025 |
| Thickness (A) | 500–550 | 500–550 |
| Substrate | 250 A TaN | 250 A TaN (tantalum nitride) |
| Density (g/cm$^3$) | 8.92* | 6.00* |

*Density estimated based on Lange's Handbook of Chemistry

The wafers were cut into square pieces (approximately 2×2 cm). Next, the prepared wafer surfaces were cleaned by sonicating in acetone for 5 minutes, then dried by blowing nitrogen gas, followed by further drying in an oven at 110° C. for 10 minutes. Afterwards, the wafers were cooled. The total weight of the cleaned wafers were measured by using an analytical microbalance, which has a 5-decimal scale below zero point in gram scale.

Several pieces of cut up wafers cleaned by the procedure described, both of Cu and CuOx, were placed in a plastic dipping basket having numerous small holes and dipped into the above-prepared solution with the basket at room temperature with mild agitation from a magnetic stirrer. Every piece was taken out of the cleaner solution every 10 minutes for a period up to 60 minutes, followed by a deionized water rinse for 5 minutes using a continuous flow of water. Then, the wafers were completely dried, by blowing dry nitrogen gas and putting them in an oven at 100° C. for 10 minutes. Each wafer was re-weighed after treatment, after cooling.

The etching rates of Cu and CuOx films were calculated by using the following equation:

$$\text{Etch Rate} = (W_b - W_a)/A \times D \times T$$

Where $W_b$ and $W_a$ are the wafer weights in grams before and after treatment, respectively, and A is the surface area in $cm^2$, D is an estimated density of Cu or CuOx in $g/cm^3$, and T is the time of the treatment in the cleaner in minutes. The obtained etching rates are in cm/min, which can be changed to A/min by multiplying by $10^8$.

Additional examples are provided in Table 1, where etching rate results are shown for formulations.

TABLE 1

| | Formulation | | | | Etch Rate (A/min) @ RT | | | |
|---|---|---|---|---|---|---|---|---|
| Example | HAS wt % | CA wt % | HF wt % | CA/HF | CuOx | Cu | CuOx/Cu | pH |
| 1 | 0.2 | 0.1 | 0.1 | 1 | 24.3 | 0.1 | 243 | 3.37 |
| 2 | 0.2 | 0.5 | 0.5 | 1 | 17.3 | 0.1 | 173 | 3.24 |
| 3 | 0.2 | 0.5 | 0.1 | 5 | 9.6 | 0.1 | 96 | 3.30 |
| 4 | 0.4 | 0.1 | 0.5 | 0.2 | 24.5 | 16.9 | 1.4 | 3.37 |
| 5 | 0.4 | 0.5 | 0.5 | 1 | 30.6 | 5.8 | 5.3 | 3.29 |
| 6 | 0.4 | 1 | 0.5 | 2 | 26.0 | 1.9 | 13.7 | 3.26 |
| 7 | 0.4 | 0.1 | 0.1 | 1 | 33.2 | 25.4 | 1.3 | 3.41 |
| 8 | 0.4 | 0.5 | 0.1 | 5 | 24.8 | 11.1 | 2.2 | 3.37 |
| 9 | 0.4 | 1 | 0.1 | 10 | 14.9 | 5.7 | 2.6 | 3.31 |
| 10 | 0.2 | 0.1 | 0.5 | 0.2 | 19.7 | 2.7 | 7.3 | 3.27 |
| 11 | 0.2 | 1 | 0.1 | 10 | 20.1 | 4.0 | 5.0 | 3.23 |
| 12 | 0.2 | 1 | 0.5 | 2 | 11.5 | 5.3 | 2.2 | 3.17 |
| 13 | 0.2 | 0.1 | 0.05 | 2 | 17.6 | 1.71 | 10.2 | 3.41 |
| 14 | 0.2 | 0.1 | 0.03 | 3.3 | 9.7 | 0.85 | 11.4 | 3.36 |
| 15 | 0.2 | 0.5 | 0.25 | 2 | 17.4 | 2.85 | 6.1 | 3.37 |
| 16 | 0.2 | 0.5 | 0.15 | 3.3 | 11.8 | 1.3 | 9.1 | 3.10 |
| 17 | 0.2 | 0.7 | 0.7 | 1 | 16.1 | 1.8 | 8.9 | 3.15 |
| 18 | 0.2 | 0.7 | 0.23 | 3 | 9.5 | 1.1 | 8.6 | 2.32 |
| 19 | 0.2 | 0.7 | 0.14 | 5 | 15.8 | 1.5 | 10.5 | 2.67 |
| 20 | 0.2 | 1 | 1 | 1 | 25.4 | 1 | 25.4 | 3.21 |

The following conclusions were drawn from the data presented in Table 1:

(1) The Cu etching rate increases as the concentration of HAS and HF increases.

(2) The CuOx etching rate, on the other hand, tends to decrease as the HF concentration increases.

(3) The resulting selectivity parameter of etching, that is, the ratio of the etching rate of CuOx over Cu, appears to be less dependent on the cleaner composition parameters, such as the concentration of HAS, CA, and HF.

(4) However, there are several exceptional data points, which show a very high value for the selectivity parameter, e.g. Examples 1–3. In particular, Examples 1 and 2 have some unique formulary features, such as a molar ratio of CA to HF that equals one.

Therefore, it can be said that the best formulation is based on the equal molar ratio of CA/HF at low concentration of HF below 0.5 wt. %. When the HF concentration increases above this point, the Cu etching rate tends to increase beyond an acceptable level that is less than 1 A/min.

The present invention has been described with particular reference to the preferred forms thereof. It will be obvious to one of ordinary skill in the art that changes and modifications may be made therein without departing from the spirit and scope of the present invention as defined by the following claims.

What is claimed is:

1. A composition for selective etching of oxides over a metal comprising:
    (a) water;
    (b) hydroxylammonium salt in an amount about 0.1 wt. % to about 0.5 wt. % of said composition;
    (c) carboxylic acid selected from the group consisting of: formic acid, acetic acid, propionic acid, valeric acid, isovaleric acid, oxalic acid, malonic acid, succinic acid, glutaric acid, maleic acid, fimaric acid, phthalic acid, 1,2,3-benzenetricarboxylic acid, glycolic acid, lactic acid, citric acid, salicylic acid, tartaric acid, gluconic acid, and mixtures thereof;
    (d) a fluorine-containing compound; and
    (e) optionally, base.

2. The composition of claim 1, further comprising a water-miscible organic solvent.

3. The composition of claim 1, wherein said composition has a pH of about 2 to 6.

4. The composition of claim 3, wherein said composition has a pH of about 3.0 to 4.5.

5. The composition of claim 1, wherein said hydroxylammonium salt is selected from the group consisting of hydroxylammonium sulfate, hydroxylammonium nitrate, hydroxylammonium phosphate, hydroxylanimonium chloride, hydroxylammonium oxalate, hydroxylammonium citrate, hydroxylammonium lactate, and mixtures thereof.

6. The composition of claim 1, wherein said fluorine containing compound is about 0.01 wt. % to 0.5 wt. % of said composition.

7. The composition of claim 1, wherein said fluorine containing compound is selected from the group consisting of hydrogen fluoride, ammonium fluoride, hydrogen fluoride pyridine salt, hydrogen fluoride imidazole salt, tetramethylammonium fluoride, tetraethylammonium fluoride, hydrogen fluoride polyvinylpyridine salt, hydrogen fluoride polyvinylimidazole salt, hydrogen fluoride polyallylamine salt, and mixtures thereof.

8. The composition of claim 1, wherein said base is selected from the group consisting of tetramethylammonium hydroxide, tetraethylanmmonium hydroxide, and mixtures thereof.

9. The composition of claim 1, wherein said carboxylic acid is about 0.1 wt. % to 1.0 wt. % of said composition.

10. A composition for selective etching of oxides over a metal substrate comprising:

(a) water;
(b) about 0.1 wt. % to 0.5 wt. % hydroxylammonium sulfate;
(c) about 0.1 wt. % to 1.0 wt. % citric acid; and
(d) about 0.01 wt. % to 0.5 wt. % hydrogen fluoride.

11. The composition of claim 10, wherein said composition has a pH of about 3.0 to 4.5.

12. The composition of claim 10, wherein said composition has a molar ratio of citric acid to hydrogen fluoride of about 1 to 5.

* * * * *